United States Patent
Smith

(10) Patent No.: US 8,546,179 B2
(45) Date of Patent: Oct. 1, 2013

(54) METHOD OF FABRICATING A SELF-ALIGNED TOP-GATE ORGANIC TRANSISTOR

(75) Inventor: Euan Smith, Longstanton (GB)

(73) Assignee: Cambridge Display Technology Ltd., Cambridgeshire (GB)

( * ) Notice: Subject to any disclaimer, the term of this patent is extended or adjusted under 35 U.S.C. 154(b) by 0 days.

(21) Appl. No.: 12/645,101

(22) Filed: Dec. 22, 2009

(65) Prior Publication Data

US 2010/0227434 A1 Sep. 9, 2010

(30) Foreign Application Priority Data

Dec. 23, 2008 (GB) .................................. 0823424.7

(51) Int. Cl.
*H01L 51/40* (2006.01)

(52) U.S. Cl.
USPC ....... 438/99; 438/160; 438/161; 257/E51.003

(58) Field of Classification Search
USPC .................... 438/99, 160, 161; 257/E51.003
See application file for complete search history.

(56) References Cited

U.S. PATENT DOCUMENTS

| | | | | |
|---|---|---|---|---|
| 4,945,067 A * | 7/1990 | Huang | | 438/157 |
| 6,184,069 B1 * | 2/2001 | Wu | | 438/155 |
| 6,380,009 B1 * | 4/2002 | Battersby | | 438/161 |
| 6,579,804 B1 * | 6/2003 | Zhou et al. | | 438/708 |
| 2002/0168789 A1 * | 11/2002 | Wong | | 438/30 |
| 2005/0051770 A1 | 3/2005 | Ando et al. | | |
| 2005/0106507 A1 | 5/2005 | Bernds et al. | | |
| 2005/0221203 A1 * | 10/2005 | Fujii | | 430/5 |
| 2005/0254035 A1 * | 11/2005 | Frankel | | 355/69 |
| 2006/0060855 A1 | 3/2006 | Lee et al. | | |
| 2006/0216872 A1 | 9/2006 | Arai et al. | | |
| 2007/0026585 A1 * | 2/2007 | Wong et al. | | 438/151 |
| 2007/0178616 A1 | 8/2007 | Arai et al. | | |
| 2008/0102567 A1 * | 5/2008 | Wang et al. | | 438/155 |
| 2009/0166612 A1 * | 7/2009 | Cain et al. | | 257/40 |

FOREIGN PATENT DOCUMENTS

| | | |
|---|---|---|
| EP | 1544905 A1 | 6/2005 |
| EP | 1748477 A2 | 1/2007 |
| JP | 2067757 A | 3/1990 |
| JP | WO-0059027 A1 | 10/2000 |
| JP | 2003158134 A | 5/2003 |
| KR | 100832873 | 5/2008 |
| WO | WO-2004055920 A2 | 7/2004 |
| WO | WO-2005022664 A2 | 3/2005 |
| WO | WO-2007110671 A2 | 10/2007 |
| WO | WO-2008144762 A2 | 11/2008 |
| WO | WO-2009005221 A1 | 1/2009 |

OTHER PUBLICATIONS

International Search Resort for PCT/GB2007/050160 dated Oct. 29, 2007.
Search Resort for GB 0823424.7 dated Mar. 3, 2009.

* cited by examiner

*Primary Examiner* — Angel Roman
(74) *Attorney, Agent, or Firm* — Marshall, Gerstein & Borun LLP

(57) ABSTRACT

A method of fabricating a self-aligned top-gate organic transistor comprises depositing a photoresist material over the dielectric material, and exposing the photoresist material to irradiation through the substrate using the source and drain electrodes as a mask. The exposure defines a region for deposition of the gate electrode.

9 Claims, 3 Drawing Sheets

US 8,546,179 B2

METHOD OF FABRICATING A SELF-ALIGNED TOP-GATE ORGANIC TRANSISTOR

BACKGROUND OF THE INVENTION

1. Field of the Invention

The present invention relates, in general, to a method of fabricating a self-aligned top gate organic transistor. More particularly, the invention relates to a self-aligned deposition of a gate electrode forming part of an organic field effect transistor.

2. Related Technology

Transistors can be divided into two main types: bipolar junction transistors and field-effect transistors. Both types share a common structure comprising three electrodes with a semi-conductive material disposed therebetween in a channel region. The three electrodes of a bipolar junction transistor are known as the emitter, collector, and base, whereas in a field-effect transistor the three electrodes are known as the source, drain, and gate. Bipolar junction transistors may be described as current-operated devices as the current between the emitter and collector is controlled by the current flowing between the base and emitter. In contrast, field-effect transistors may be described as voltage-operated devices as the current flowing between source and drain is controlled by the voltage between the gate and the source.

Transistors can also be classified as p-type and n-type according to whether they comprise semi-conductive material which conducts positive charge carriers (holes) or negative charge carriers (electrons) respectively. The semi-conductive material may be selected according to its ability to accept, conduct, and donate charge. The ability of the semi-conductive material to accept, conduct, and donate holes or electrons can be enhanced by doping the material. The material used for the source and drain electrodes can also be selected according to its ability to accept and inject holes or electrodes.

For example, a p-type transistor device can be formed by selecting a semi-conductive material that is efficient at accepting, conducting, and donating holes and selecting a material for the source and drain electrodes that is efficient at injecting and accepting holes from the semi-conductive material. Good energy-level matching of the Fermi-level in the electrodes with the highest occupied molecular orbital (HOMO) level of the semi-conductive material can enhance hole injection and acceptance. In contrast, an n-type transistor device can be formed by selecting a semi-conductive material which is efficient at accepting, conducting, and donating electrons, and selecting a material for the source and drain electrodes which is efficient at injecting electrons into, and accepting electrons from, the semi-conductive material. Good energy-level matching of the Fermi-level in the electrodes with the lowest occupied molecular orbital (LUMO) level of the semi-conductive material can enhance electron injection and acceptance.

Transistors can be formed by depositing the components in thin films to form a thin film transistor (TFT). When an organic material is used as the semi-conductive material in such a device, it is known as an organic thin film transistor (OTFT).

Various arrangements for organic thin film transistors are known. One such device is an insulated gate field-effect transistor which comprises source and drain electrodes with a semi-conductive material disposed therebetween in a channel region, a gate electrode disposed adjacent the semi-conductive material and a layer of insulting material disposed between the gate electrode and the semi-conductive material in the channel region.

OTFTs may be manufactured by low-cost, low-temperature methods such as solution processing. Moreover, OTFTs are compatible with flexible plastic substrates, offering the prospect of large-scale manufacture of OTFTs on flexible substrates in a roll-to-roll process.

It is known to provide a gate electrode at the top of an organic thin film transistor to form a so-called top-gate organic thin film transistor. An example of a top-gate organic thin film transistor can be found in U.S. Pat. No. 6,734,505.

In such an architecture source and drain electrodes are deposited on a substrate and spaced apart to define a channel region therebetween. A layer of an organic semiconductor material is deposited in the channel region to connect the source and drain electrodes and may extend at least partially over the source and drain electrodes. An insulating layer of dielectric material is deposited over the organic semiconductor material and may also extend at least partially over the source and drain electrodes. A gate electrode is deposited over the insulating layer and located over the channel region.

The substrate may be rigid or flexible. Rigid substrates may be selected from glass or silicon and flexible substrates may comprise thin glass or plastics such as poly(ethylene terephthalate) (PET), poly(ethylene-naphthalate) (PEN), polycarbonate, and polyimide.

The organic semiconductive material may be made solution processable through the use of a suitable solvent. Exemplary solvents include mono- or poly-alkylbenzenes such as toluene and xylene; tetralin; and chloroform. Preferred solution deposition techniques include spin-coating and ink jet printing. Other solution deposition techniques include dip-coating, roll printing and screen printing.

Preferred organic semiconductor materials include small molecules such as optionally substituted pentacene; optionally substituted polymers such as polyarylenes, in particular polyfluorenes and polythiophenes; and oligomers. Blends of materials, including blends of different material types (e.g. a polymer and small molecule blend) may be used.

For a p-channel OTFT, preferably the source and drain electrodes comprise a high workfunction material, preferably a metal, with a workfunction of greater than 3.5 eV, for example gold, platinum, palladium, molybdenum, tungsten, or chromium. More preferably, the metal has a workfunction in the range of from 4.5 to 5.5 eV. Other suitable compounds, alloys and oxides such as molybdenum trioxide and indium tin oxide may also be used. The source and drain electrodes may be deposited by thermal evaporation and patterned using standard photolithography and lift off techniques as are known in the art.

Alternatively, conductive polymers may be deposited as the source and drain electrodes. An example of such a conductive polymer is poly(ethylene dioxythiophene) (PEDOT) although other conductive polymers are known in the art. Such conductive polymers may be deposited from solution using, for example, spin coating or ink jet printing techniques and other solution deposition techniques discussed above.

For an n-channel OTFT, preferably the source and drain electrodes comprise a material, for example a metal having a workfunction of less than 3.5 eV such as calcium or barium or a thin layer of metal compound, in particular an oxide or fluoride of an alkali or alkali earth metal for example lithium fluoride, barium fluoride and barium oxide. Alternatively, conductive polymers may be deposited as the source and drain electrodes.

The length of the channel defined between the source and drain electrodes may be up to 500 microns, but preferably the length is less than 200 microns, more preferably less than 100 microns, most preferably less than 20 microns.

The gate electrode can be selected from a wide range of conducting materials for example a metal (e.g. gold) or metal compound (e.g. indium tin oxide). Alternatively, conductive polymers may be deposited as the gate electrode. Such conductive polymers may be deposited from solution using, for example, spin coating or ink jet printing techniques and other solution deposition techniques discussed above.

Thicknesses of the gate electrode, source and drain electrodes may be in the region of 5 mm-200 nm, although typically 50 nm as measured by Atomic Force Microscopy (AFM), for example.

The insulating layer comprises a dielectric material selected from insulating materials having a high resistivity. The dielectric constant, k, of the dielectric is typically around 2-3 although materials with a high value of k are desirable because the capacitance achievable for an OTFT is directly proportional to k, and the drain current $I_D$ is directly proportional to the capacitance. Thus, in order to achieve high drain currents with low operational voltages, OTFTs with thin dielectric layers in the channel region are preferred.

The dielectric material may be organic or inorganic. Preferred inorganic materials include $SiO_2$, $SiN_x$ and spin-on-glass (SOG). Preferred organic materials are generally polymers and include insulating polymers such as poly vinylalcohol (PVA), polyvinylpyrrolidine (PVP), acrylates such as polymethylmethacrylate (PMMA) and benzocyclobutanes (BCBs) available from Dow Corning. The insulating layer may be formed from a blend of materials or comprise a multi-layered structure.

The dielectric material may be deposited by thermal evaporation, vacuum processing, or lamination techniques as are known in the art. Alternatively, the dielectric material may be deposited from solution using, for example, spin coating or ink jet printing techniques and other solution deposition techniques discussed above.

In a top-gate architecture, the dielectric material is deposited from solution onto the organic semiconductor and should not result in dissolution of the organic semiconductor. Techniques to avoid such dissolution include: use of orthogonal solvents, that is use of a solvent for deposition of the uppermost layer that does not dissolve the underlying layer; and crosslinking of the underlying layer.

The thickness of the insulating layer is preferably less than 2 micrometres, more preferably less than 500 nm.

Other layers may be included in the device architecture. For example, a self assembled monolayer (SAM) may be deposited on the gate, source or drain electrodes, substrate, insulating layer, and organic semiconductor material to promote crystallity, reduce contact resistance, repair surface characteristics, and promote adhesion where required. In particular, the dielectric surface in the channel region may be provided with a monolayer comprising a binding region and an organic region to improve device performance, e.g. by improving the organic semiconductor's morphology (in particular polymer alignment and crystallinity) and covering charge traps, in particular for a high k dielectric surface. Exemplary materials for such a monolayer include chloro- or alkoxy-silanes with long alkyl chains, e.g. octadecyltrichlorosilane. Similarly, the source and drain electrodes may be provided with a SAM to improve the contact between the organic semiconductor and the electrodes. For example, gold source and drain electrodes may be provided with a SAM comprising a thiol binding group and a group for improving the contact which may be a group having a high dipole moment; a dopant; or a conjugated moiety.

In order to fabricate an organic electronic circuit such as an active matrix display backplane it is necessary to pattern the core active components of an organic transistor such as the organic semiconductor and dielectric layers. Patterning allows each organic transistor to be isolated from each other and avoids the presence of a continuous organic semiconductor film which can introduce cross talk between organic transistors in the electronic circuit compromising circuit performance. Organic semiconductor and dielectric patterning is also required to open up vias to allow upper and lower metallization layers to make contact.

One approach to patterning is to pattern the organic semiconductor layer or dielectric layers directly using targeted ink jet printing techniques. However targeting droplets of active material using a ink jet print head is challenging and due in part to differences of morphology between different ink formulations and process conditions, the performance of ink jet printed organic transistors is typically below that of corresponding organic transistors in which the layers have been coated by other techniques.

Poor alignment between conducting layers can cause a problem of capacitance caused by overlap between a source and/or drain electrodes and a gate electrode. The presence of capacitance can have a significant impact in terms of circuit response time and current leakage, particularly where there are a large number of devices in parallel such as a large number of switch transistors on a data line. In addressing the problem, it is noted that some overlap is preferable to a gap which, in introducing a much increased contact resistance, would have a much worse effect on RC constant.

General Description

Accordingly, the invention provides a method of fabricating a self aligned top-gate organic transistor in which any overlap between gate electrode and source/drain electrodes is minimized together with minimizing any presence of a gap between gate electrode and source/drain electrodes.

According to a first aspect of the invention, there is provided a method of fabricating a top-gate organic semiconductor transistor comprising: providing a substrate; patterning a source and drain electrode over the substrate; depositing an organic semiconductor material in a channel between the source and drain electrodes; depositing a dielectric material over the organic semiconductor material; and depositing a gate electrode over the dielectric material and channel; the method characterized by: depositing a photo-patternable material over the dielectric material, and exposing the photo-patternable material to irradiation through the substrate using the source and drain electrodes as a mask.

Irradiating the transistor through a gap between the source/drain electrodes causes a region to be exposed having dimensions and orientation substantially equal to the gap between the source and drain electrodes. The region can be used to define the location of the gate electrode.

Structurally, the method removes or at least mitigates any gate and source/drain overlap or gap thereby advantageously reducing input and output capacitance.

The photo-patternable material is preferably a photoresist although it may be a photo-patternable conductor suitable for operation as a gate electrode.

Preferably, the irradiation is two-photon exposure. Using two-photon exposure allows irradiation through the layers of the transistor using visible wavelength irradiation rather than UV wavelength irradiation thereby avoiding damage to the organic semiconductor material.

Preferably, the two-photon exposure is between 600 nm and 900 nm. Particular choices of excitation wavelengths for specific photoresists provide improvements in the ability to two-photon expose photoresist in a single shot.

Although all the exposure is preferably made through the substrate using the source and drain as a mask; optionally a first exposure can be made through the substrate using the source and drain electrodes as a mask and a second exposure made from a location on the other side of the substrate thereby through/on an outer layer of the transistor. In this way, both sides of the transistor are exposed. Advantageously, a high intensity irradiation can be used through/on the outer layer because the high intensity radiation does not need to pass through the organic semiconductor material, whereas a low intensity radiation can be used through the substrate using the source and drain as a mask. The area where patterning occurs is only where both the high intensity radiation and low intensity radiation coincide, which due to the masking of the source and drain electrodes is the region intended for location of a gate electrode. Advantageously, allowing at least a portion of the exposure to be a higher intensity radiation gives more control over the process and a higher yield.

Preferably, the second exposure comprises a wavelength of around 500 nm to 800 nm and the first exposure comprises a wavelength of around 700 nm to 1000 nm.

Preferably the photoresist is a positive resist. Alternatively, the photoresist is a negative resist.

Where the photoresist material is a negative resist, the method preferably includes depositing the gate electrode over the dielectric material and channel and subsequently depositing the photoresist material over the gate electrode prior to the step of exposing. The photoresist material in the region of the channel between the source and drain electrode is hardened during the step of exposing and so a subsequent step can involve developing the photoresist material and then removing the photoresist material and etching or otherwise removing the gate electrode unprotected by the hardened photoresist material. In this way, the gate electrode remains accurately self-aligned between the source/drain electrodes. The hardened photoresist material over the gate electrode can optionally be removed as required.

Where the photoresist is a positive resist, the photoresist material is preferably deposited over the dielectric material prior to the depositing of the gate electrode. The photoresist material is exposed and softens in the region of the channel between the source and drain electrode. The softened photoresist can be removed and a gate electrode deposited in the region over the dielectric material. Any remaining photoresist material adjacent the gate electrode can be removed, which may include surplus gate electrode material washed away with the removal of the photoresist material.

Preferably, the photoresist material is SU-8. Such a photoresist is commercially available from Microlithography Chemical Corporation and has well defined properties. In Optics Letters, Vol 23, no, 22 Nov. 15, 1998, p 1745; Witzgall et al report on a single shot, two-photon exposure of commercially available SU-8 photoresist for the production of three-dimensional structures.

BRIEF DESCRIPTION OF THE DRAWINGS

At least one embodiment will now be described, by way of example only, and with reference to the accompanying drawings in which.

DETAILED DESCRIPTION

Figure 1:
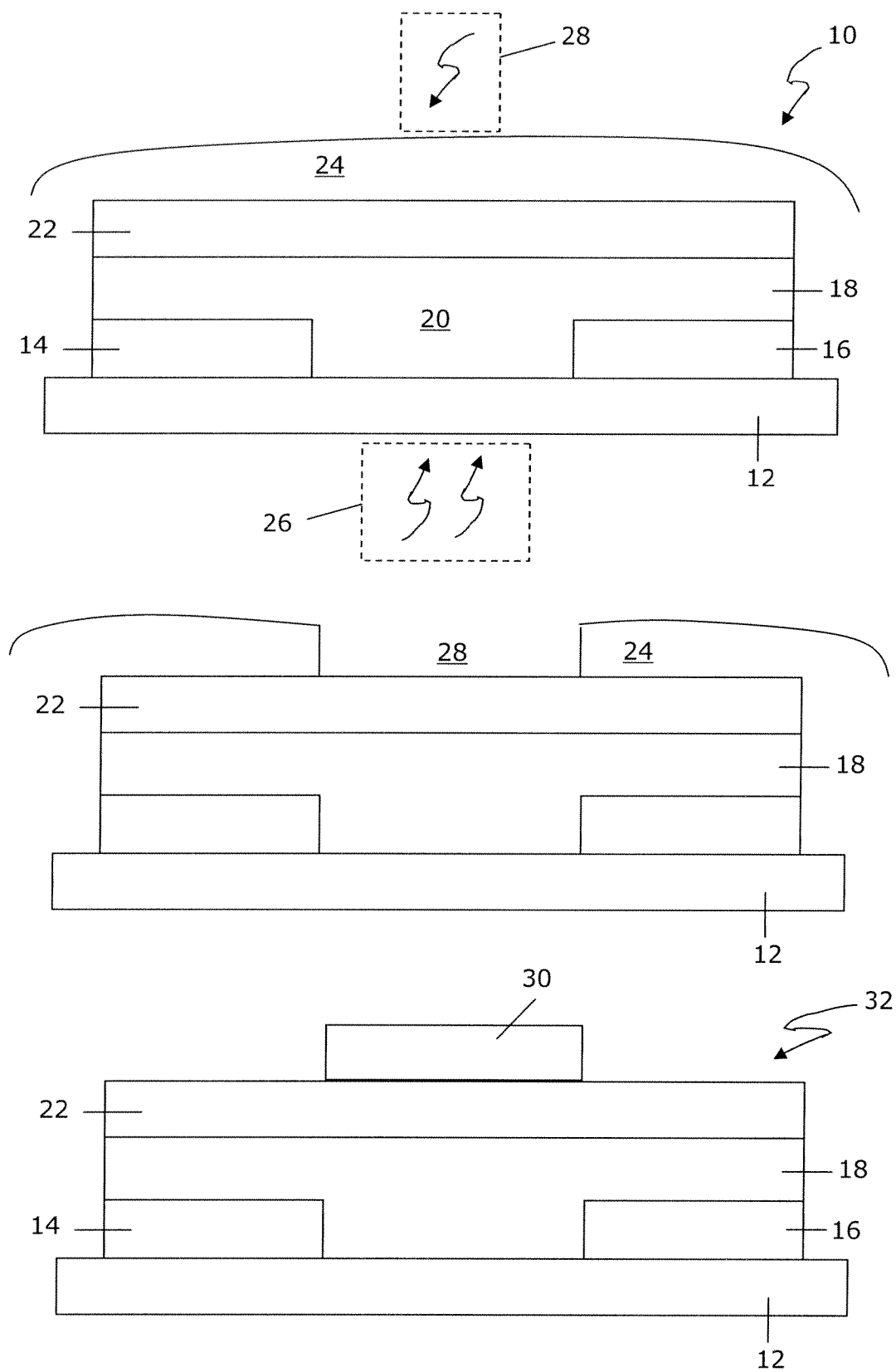
FIG. 1 is a schematic diagram of a method of fabricating a top-gate organic transistor according to a first embodiment of the present invention.

Thus, referring to FIG. 1, a first embodiment of the present invention comprises a partially fabricated organic transistor 10 having a substrate 12, patterned source 14 and drain 16 electrodes deposited on the substrate 12 and a layer of organic semiconductor material 18 deposited over the source 14 and drain 16 electrodes. The layer of organic semiconductor material 18 is also deposited within a channel 20 defined between source 14 and drain 16 electrodes. A layer of dielectric material 22 is deposited on the organic semiconductor material 18 and a layer of positive photoresist 24 is deposited on the layer of dielectric material 22.

In operation of an exposing step, a two-photon exposure 26 is irradiated through the substrate 12 towards the photoresist 24. Alternatively, a two-photon exposure 28 can be performed using one wavelength from above the transistor 10 and one wavelength from below so that the photoresist 24 can develop where the two beams of irradiation coincide. Both wavelengths from above and below can be the same wavelength because two-photon exposure is highly non-linear and so there exists a clearly defined threshold of optical power density below which two-photon exposure is ineffective, therefore where the photoresist is only exposed by a single source there will be no exposure of the photoresist because the total intensity level will be insufficient to take the fluence above the activation threshold.

A person skilled in the art knows how to select suitable intensity values, exposure times and wavelengths to take into account the transmission properties of the substrate 12 and the sensitivity of the materials to irradiation used in the transistor 10.

Following the exposing step, a portion of the photoresist 24 is softened where is has been sufficiently exposure and provides a softened region 28 co-located with the gap between the source 14 and drain 16 electrodes. The photoresist is then developed to remove the softened region 28. In a subsequent step a gate electrode 30 can be deposited over the photoresist 24 prior to removal (known in the art as "lift-off") of the gate electrode 30 and photoresist 24 located in the regions adjacent the gap. Accordingly, a self-aligned top-gate organic field effect transistor 32 is provided.

Figure 2:
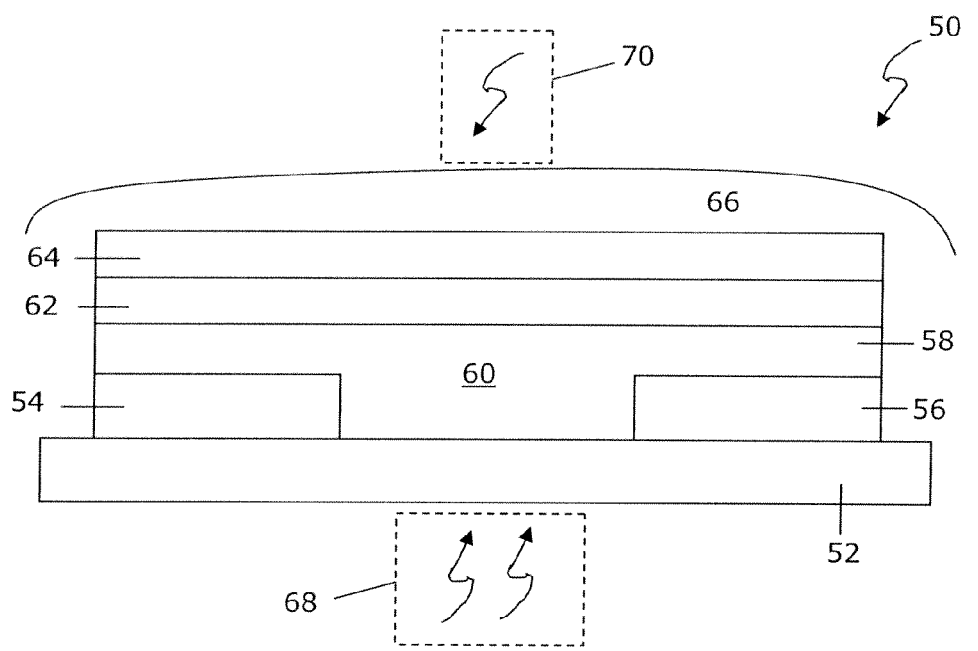
FIG. 2 is a schematic diagram of a method of fabricating a top-gate organic transistor according to a second embodiment of the present invention.
Figure 2:
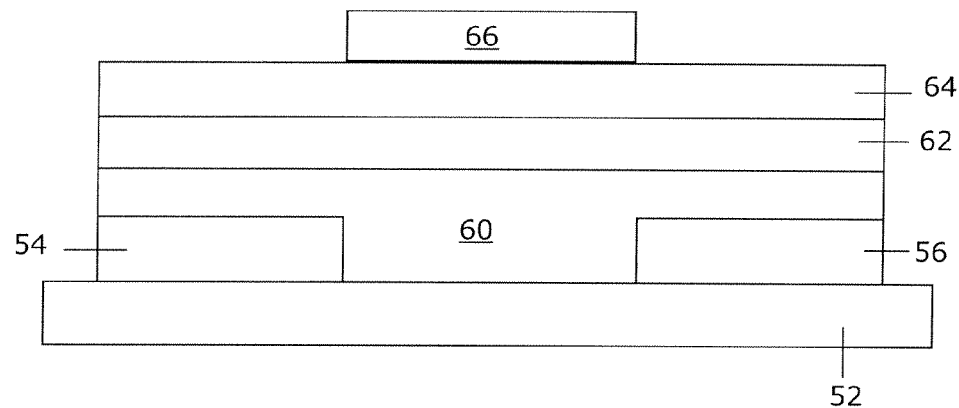
Figure 2:
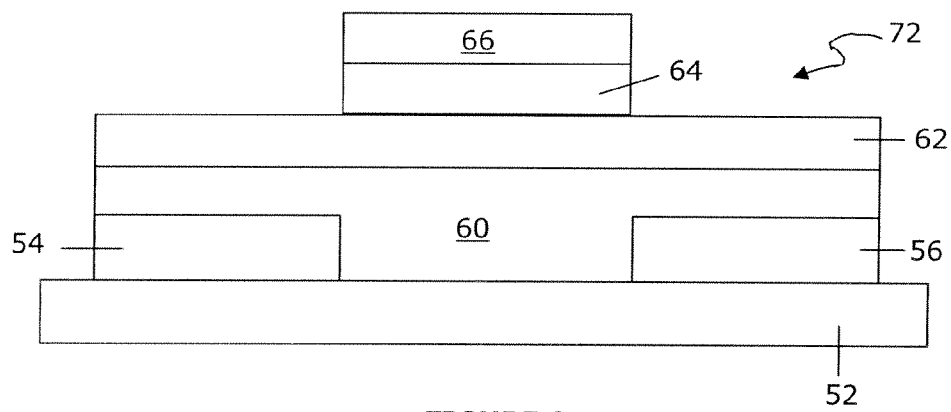

Referring to FIG. 2, a second embodiment of the present invention comprises a partially fabricated organic transistor 50 having a substrate 52, patterned source 54 and drain 56 electrodes deposited on the substrate 52 and a layer of organic semiconductor material 58 deposited over the source 54 and drain 56 electrodes. The layer of organic semiconductor material 58 is also deposited within a channel 60 defined between source 54 and drain 56 electrodes. A layer of dielectric material 62 is deposited on the organic semiconductor material 58 and a gate electrode 64 is deposited on the layer of dielectric material 62. A layer of negative photoresist 66 is deposited over the gate electrode 64.

In operation of an exposing step, a two-photon exposure 68 is irradiated through the substrate 52 towards the photoresist 66. Alternatively, a two-photon exposure 70 can be performed using one wavelength from above the transistor 50 and one wavelength from below so that the photoresist 66 can develop where the two beams of irradiation coincide. Both wavelengths from above and below can be the same wavelength because two-photon exposure is highly non-linear and so there exists a clearly defined threshold of optical power density below which two-photon exposure is ineffective, therefore where the photoresist is only exposed by a single source there will be no exposure of the photoresist because the total intensity level will be insufficient to take the fluence above the activation threshold.

A person skilled in the art knows how to select suitable intensity values, exposure times and wavelengths to take into account the transmission properties of the substrate 52 and the sensitivity of the materials to irradiation used in the transistor 50.

Following the exposing step, a portion of the photoresist 66 is hardened where is has been exposed and the photoresist 66 that has not hardened is subsequently removed in a development step using a suitable washing process as is known in the art. The removal provides photoresist 66 co-located with the gap between the source 54 and drain 56 electrodes.

Since a portion of the gate electrode 64 lying under the photoresist 66 is protected, the remaining gate electrode 64 can be removed using an etching or other suitable removal process delivered from above the photoresist 66. In a further step the remaining photoresist 66 can be removed. Accordingly, a self-aligned top-gate organic field effect transistor 72 is provided.

A person skilled in the art will realize that as an alternative to using photoresist in the above process a directly photo-patternable gate electrode can be used if the gate material hardens upon two-photon exposure.

Figure 3:
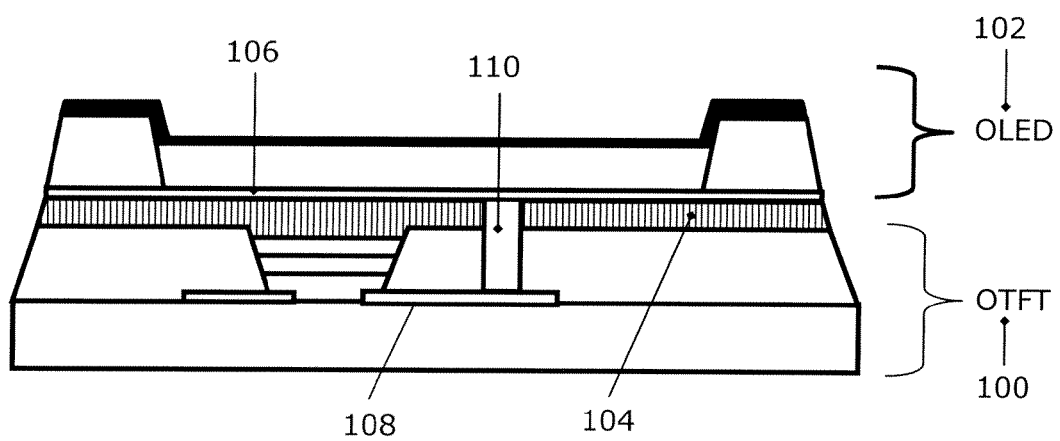
FIG. 3 is a schematic diagram of an organic thin film transistor fabricated in a stacked relationship to an organic light emitting device according to a third embodiment of the present invention.

FIG. 3 is a schematic diagram of a top-gate organic thin film transistor 100 fabricated in a stacked relationship to an organic light emitting device 102 according to a third embodiment of the present invention. The active areas of the OTFT 100 and OLED 102 are defined by two separate bank layers—one for the OLED 102 and one for the OTFT 100. A linearization layer 104 (also known as a passivation layer) is deposited over the OTFT 100. Exemplary passivation layers 104 include BCBs and parylenes. The organic light emitting device 102 is fabricated over the passivation layer 104 and the anode 106 of the organic light emitting device 102 is electrically connected to the drain electrode 108 of the OTFT 100 by a conductive via 110 passing through passivation layer 104 and bank layer.

It will be appreciated that pixel circuits comprising an OTFT and an optically active area (e.g. light emitting or light sensing area) may comprise further elements. In particular, the OLED pixel circuits of FIG. 3 may typically comprise least one further transistor in addition to the driving transistor shown, and at least one capacitor. It will be appreciated that the organic light emitting devices described herein may be top or bottom-emitting devices. That is, the devices may emit light through either the anode or cathode side of the device. In a transparent device, both the anode and cathode are transparent. It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminum.

Transparent cathodes are particularly advantageous for active matrix devices because emission through a transparent anode in such devices may be at least partially blocked by OTFT drive circuitry located underneath the emissive pixels as can be seen from the embodiment illustrated in FIG. 3.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A method of fabricating a top-gate organic semiconductor transistor comprising: providing a substrate; patterning a source and drain electrode over the substrate; depositing an organic semiconductor material in a channel between the source and drain electrodes; depositing a dielectric material over the organic semiconductor material; and depositing a gate electrode over the dielectric material and channel; the method characterized by: depositing a photo-patternable material over the dielectric material, and exposing the photo-patternable material to irradiation through the substrate using the source and drain electrodes as a mask, wherein the irradiation is two-photon exposure.

2. A method as claimed claim 1, wherein the photo-patternable material is a positive photoresist.

3. A method as claimed in claim 1, wherein the two-photon exposure is between 600 nm and 900 nm.

4. A method as claimed in claim 1, wherein the two-photon exposure includes a first exposure through the substrate using the source and drain electrodes as a mask and a second exposure made from a location on the other side of the substrate.

5. A method a claimed in claim 4, wherein the second exposure comprises a wavelength of around 500 nm to 800 nm and the first wavelength comprises a wavelength of around 700 nm to 1000 nm.

6. A method as claimed in claim 2, wherein the method includes depositing the photoresist material over the dielectric material prior to the depositing of the gate electrode.

7. A method as claimed in claim 1, wherein the photo-patternable material is a photo-patternable conductor suitable for operation as a gate electrode.

8. A method as claimed in claim 7, including patterning the photo-patternable conductor using two-photon exposure.

9. A method as claimed in claim 2, wherein including developing the photoresist to remove the exposed photoresist collocated within a gap between the source and drain electrodes and depositing the gate electrode over the photoresist.

* * * * *